United States Patent [19]

Haville

[11] 4,383,317
[45] May 10, 1983

[54] SHAFT ANGLE ENCODER HAVING A CIRCUIT FOR SYNTHESIZING A SKIPPED TRACK OUTPUT SIGNAL

[75] Inventor: George D. Haville, Santa Barbara, Calif.

[73] Assignee: BEI Electronics, Inc., Little Rock, Ark.

[21] Appl. No.: 202,165

[22] Filed: Oct. 30, 1980

[51] Int. Cl.³ .................... G06F 11/10; H03K 13/34
[52] U.S. Cl. .................... 371/51; 340/347 P; 371/65
[58] Field of Search ............... 371/51, 49, 65; 340/347 P; 250/231 SE

[56] References Cited

U.S. PATENT DOCUMENTS

| | | | |
|---|---|---|---|
| 3,548,397 | 12/1970 | Dayton | 340/347 M |
| 3,882,459 | 5/1975 | Barlow et al. | 371/65 |
| 4,024,498 | 5/1977 | McIntosh | 371/65 |
| 4,146,099 | 3/1979 | Matsushima et al. | 371/65 |
| 4,146,873 | 3/1979 | Yamanaka et al. | 340/347 P |
| 4,173,752 | 11/1979 | Yamanaka | 371/51 |

*Primary Examiner*—Charles E. Atkinson
*Attorney, Agent, or Firm*—Burmeister, York, Palmatier, Hamby & Jones

[57] ABSTRACT

A shaft angle encoder for producing a multiplicity of output signals corresponding to a multidigit binary code word representing the angular position of the shaft, comprising a rotatable code member having a multiplicity of code tracks ranging in order from zero to n except for the omission of a skipped track having the order of n minus 1, the track of zero order having the largest divisions while the track of the order n has the finest divisions, transducer means for reading the tracks and producing corresponding electrical signals, a parity detector having inputs for receiving the electrical signals corresponding to the tracks having the orders of zero through n minus 2 and for producing a corresponding even/odd output, and an exclusive OR logic gate having inputs for receiving the even/odd output of said parity detector and the electrical signal corresponding to the track of the order n, the exclusive OR gate producing an output which synthesizes the electrical output signals corresponding to the skipped track of the order n minus 1. The track of the order n may be a sine track to produce a sine wave electrical signal, which is digitized before being supplied to the exclusive OR logic gate.

12 Claims, 3 Drawing Figures

SHAFT ANGLE ENCODER HAVING A CIRCUIT FOR SYNTHESIZING A SKIPPED TRACK OUTPUT SIGNAL

FIELD OF THE INVENTION

This invention relates to a shaft angle encoder, particularly of the optical type, having a rotatable disc or other code member with a multiplicity of code tracks, together with transducers for reading the code tracks and producing corresponding electrical signals which may constitute a multidigit binary code word, representing the angular position of the code member.

In such an encoder, a high degree of precision and accuracy is achieved by providing a large number of tracks on the code member. However, the allowable size of the code member imposes a limitation upon the number of tracks, particularly in applications where it is desirable to miniaturize the encoder.

OBJECTS OF THE INVENTION

One object of the present invention is to provide a new and improved shaft angle encoder having a multiplicity of tracks, but omitting a skipped track, together with means for synthesizing the electrical signals corresponding to the skipped track. In this way, one additional digit can be effectively added to the output code word represented by the output signals.

A further object is to provide a new and improved encoder of the foregoing character, having a code member with a multiplicity of tracks arranged in order from zero through n except for the omission of a skipped track having the order of n minus 1, together with a circuit for synthesizing the electrical signals corresponding to the skipped track. The track of zero order has the largest divisions, while the track of the order n has the smallest or finest divisions. The encoder of the present invention produces an output word having one more digit than the number of tracks on the code member.

SUMMARY OF THE INVENTION

To achieve these and other objects, the present invention preferably provides a shaft angle encoder, comprising a rotatable code member having a multiplicity of code tracks ranging in order from zero to n except for the omission of a skipped track having the order of n minus 1, the track of zero order having the largest divisions while the track of the order n has the finest divisions, transducer means for reading the tracks and producing corresponding electrical signals, a parity detector having inputs for receiving the electrical signals corresponding to the tracks having the orders of zero through n minus 2 and for producing a corresponding even/odd output, and an exclusive OR logic device having inputs for receiving the even/odd output of the parity detector and the electrical signal corresponding to the track of the order n, the exclusive OR logic device producing an output which synthesizes the electrical output signals corresponding to the skipped track of the order n minus 1.

The track of the order n may be a sine track which produces a sine wave electrical signal. The encoder may include means for digitizing the sine wave electrical signal and for supplying the digitized signal to the exclusive OR logic device.

The exclusive OR logic device may take the form of an exclusive OR gate.

The tracks of the order from zero through n minus 2 are preferably encoded in accordance with the Gray reflected binary code.

BRIEF DESCRIPTION OF THE DRAWINGS

Further objects, advantages and features of the present invention will appear from the following description of an illustrative embodiment, taken with the accompanying drawings, in which.

DETAILED DESCRIPTION OF THE EMBODIMENT

Figure 1:
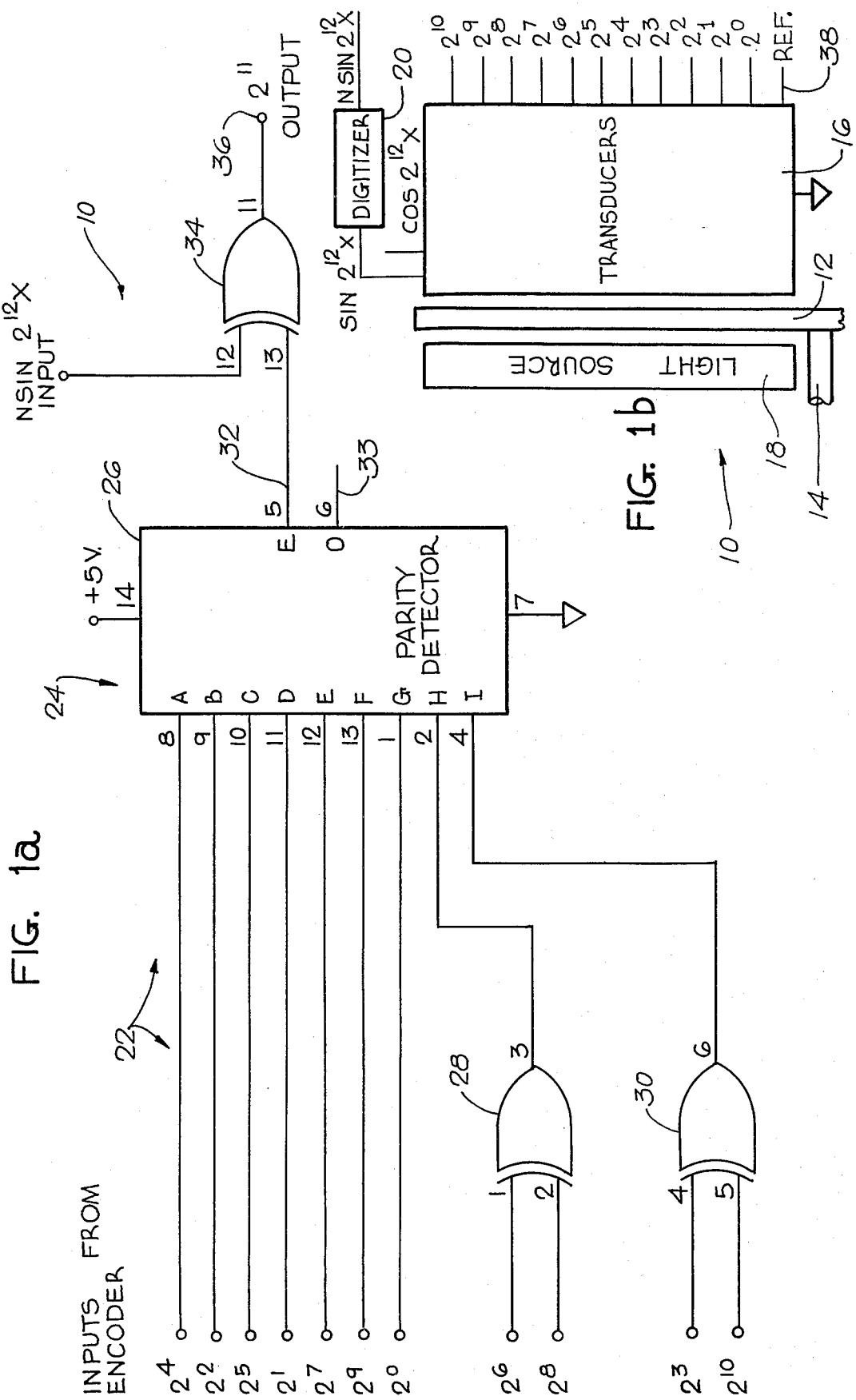
FIG. 1a is a schematic circuit diagram of a circuit for synthesizing the signals from a skipped track in a shaft angle encoder to be described as an illustrative embodiment of the present invention.
FIG. 1b is a schematic diagram illustrating other components of the encoder, including the code member, the light source, the transducers and the digitizer.

As just indicated, FIGS. 1a and 1b illustrate a shaft angle encoder 10, whic in this case is of the optical type, having a rotatable code member, illustrated as an optical code disc 12, mounted on a rotatable shaft 14. The purpose of the encoder 10 is to encode the angular position of the rotatable shaft 14, by providing a multiplicity of electrical output signals which are changeable as a function of the angular position of the shaft 14.

The code member 12 may have a multiplicity of code tracks, adapted to be read by transducer means comprising a multiplicity of individual transducers 16, adapted to produce electrical output signals corresponding to the code tracks. The illustrated code member 12 is in the form of an optical code disc, adapted to interrupt or modulate the light from a light source 18. All of the code tracks on the code member 12 are illuminated by the light source 18, which may have either a single lamp or a multiplicity of lamps or other light producing elements.

Preferably, the code disc 12 has a plurality of digital code tracks having progressively finer divisions, plus sine and cosine tracks having a still finer structure for modulating the light from the source 18. The transducers 16 include a multiplicity of photoelectric transducer elements or detectors for converting the modulated light into corresponding electrical signals.

In this case, the optical code member 12 has eleven binary code tracks ranging in successive order from zero through ten, plus sine and cosine tracks of the twelfth order. The binary code track of the eleventh order is skipped or omitted on the code disc 12. The code track of the zero order has the largest divisions on the optical code disc 12, while the tracks of the twelfth order have the finest or smallest divisions or code structure. The binary tracks of the intermediate orders, one through ten, have progressively finer digital divisions. The binary code tracks of the optical code disc 12 are preferably encoded in accordance with the Gray reflected binary code, which is well known to those skilled in the art, and is characterized by the fact that there is never more than one transition at any one time on all of the code tracks. The transitions referred to are between binary 1 and binary 0 and between binary 0 and binary 1. All of the transitions on the multiplicity of tracks occur at unique times, one at a time, to avoid ambiguities.

The transducers 16 have a multiplicity of binary outputs, corresponding to the binary code tracks of the code member 12. As illustrated in FIG. 1b, the binary outputs are designated $2^0$, $2^1$, $2^2$, $2^3$, $2^4$, $2^5$, $2^6$, $2^7$, $2^8$, $2^9$ and $2^{10}$, where the exponents are the order numbers of the binary output signals, corresponding to the order numbers of the code tracks on the disc 12. These digital output signals of the transducers 16 constitute an 11-digit binary code word, representing the angular position of the code member 12. Such binary code word is changeable as a function of such angular position.

As shown in FIG. 1b, the transducers 16 also have sine and cosine outputs, corresponding to the sine and cosine tracks on the code disc 12. Such sine and cosine outputs are designated $\sin 2^{12}x$ and $\cos 2^{12}x$, where x represents the angular position of the code member 12 in revolutions. The sine and cosine outputs produce sine wave and cosine wave electrical signals which are in quadrature, in that they are 90° apart in phase. Thus, the sine and cosine outputs of the transducers 16 produce analog output signals which are sinusoidal in waveform. The phase of such sinusoidal output signals is a function of the angular position of the code disc 12.

The sine and cosine output signals are valuable in themselves, so that it is highly desirable to produce them. For example, the sine and cosine output signals can be supplied to a phase splitting circuit which will produce a series of signals at regularly spaced phases. Such signals can be digitized to produce higher order binary signals. By the use of such phase splitter and digitizer circuits, it is possible to add at least two bits to the binary output word.

Figure 2:
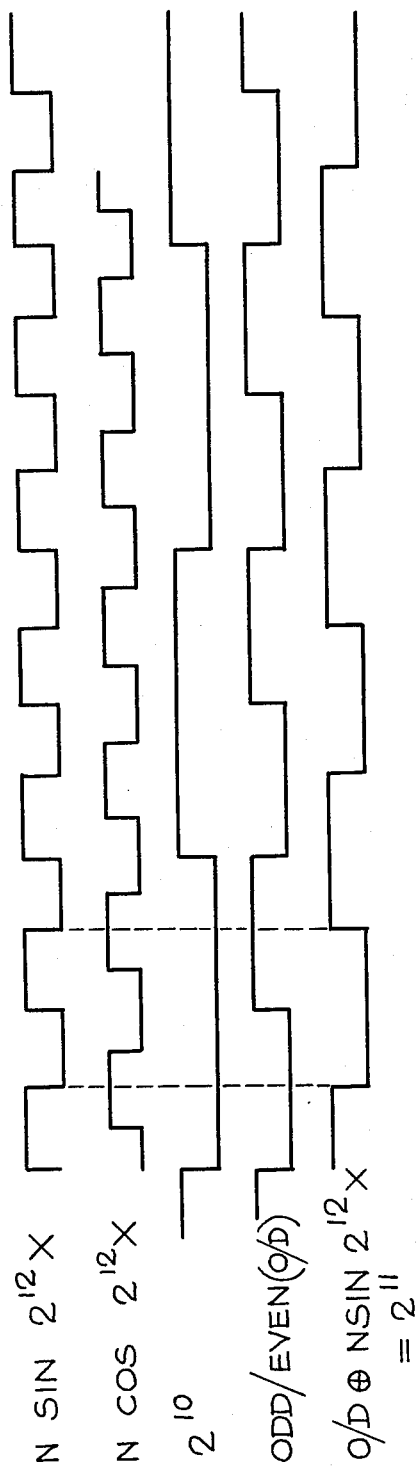
FIG. 2 is a series of waveform diagrams illustrating the operation of the embodiment.

In accordance with the present invention, it is also highly advantageous to synthesize the binary output signals corresponding to the skipped track of the eleventh order number. The skipped track output signals are synthesized from the available binary output signals $2^0$ through $2^{10}$ and the sine output signal $\sin 2^{12}x$. As shown in FIG. 1b, the sine output signal is digitized or normalized by a digitizer 20, the output of which is designated $n \sin 2^{12}x$. As shown in FIG. 2, the digitized sine signal $n \sin 2^{12}x$ is a square wave version of the sine signal. For comparison, FIG. 2 also shows a digitized or normalized cosine signal, designated $n \cos 2^{12}x$.

FIG. 1a illustrates a synthesizing circuit 22, comprising a parity detecting circuit 24, to which all of the binary signals $2^0$ through $2^{10}$ are supplied. The parity detecting circuit 24 determines whether these binary signals are even or odd. Those skilled in the art will understand that a set of binary signals, constituting a binary code word, is even if the code word contains an even number of binary 1's and is odd if the binary word contains an odd number of 1's.

The parity detecting circuit 24 of FIG. 1a employs a parity detector 26, which may be in the form of a commercially available integrated circuit. The illustrated parity detector 26 has only nine inputs, designated A through I, to handle the eleven bit code word represented by the inputs $2^0$ through $2^{10}$. Seven of the eleven binary signals are connected directly to the first seven inputs, designated A through G, such seven binary signals being those designated $2^4$, $2^2$, $2^5$, $2^1$, $2^7$, $2^9$ and $2^0$, respectively. To increase the total number of inputs of the parity detector circuit 24, exclusive OR gates or logic devices 28 and 30 are connected to the eighth and ninth inputs H and I of the parity detector 26. Each of the exclusive OR gates 28 and 30 has two inputs. Thus, the two gates 28 and 30 have a total of four inputs, which are supplied with the remaining four binary signals designated $2^6$, $2^8$, $2^3$ and $2^{10}$. Each of the exclusive OR gates 28 and 30 produces an output of binary 1 if one and only one of the two inputs is supplied with a binary 1. Thus, each exclusive OR gate produces a binary 1 output if the two inputs are odd, while producing a binary 0 output if the inputs are even.

The parity detector 26 has even and odd outputs 32 and 33. The even output 32 is connected to one of the two inputs of an exclusive OR gate or logic device 34. The other input of the exclusive OR gate 34 is supplied with the normalized or digitized sine signal $n \sin 2^{12}x$ from the output of the digitizer 20. The exclusive OR gate 34 has an output terminal 36 which delivers the skipped track binary output signal $2^{11}$, corresponding to the skipped or omitted track on the rotatable code member 12.

The effect of providing the synthesizing circuit 22 is to add one digit or bit to the binary output, so that the encoder 10 has an added capability, corresponding to one additional track. The number of tracks on the code disc or member 12 is limited by the size of the code disc. The illustrated code disc 12 has room for a maximum of 14 tracks. These tracks are the eleven binary tracks producing the outputs $2^0$ through $2^{10}$, the sine and cosine tracks producing the outputs $\sin 2^{12}x$ and $\cos 2^{12}x$ and a reference or clear track, producing a reference output 38, which is a steady or direct current output, adapted to be used in eliminating any zero offsets in the other outputs. It will be noted that the sine and cosine outputs are of the twelfth order, and not the eleventh order. In this way, the sine and cosine outputs provide a higher order of precision and accuracy in representing the angular position of the code disc 12. The eleventh order binay track on the code disc 12 is skipped or omitted. However, the corresponding eleventh order binary output $2^{11}$ is synthesized by the synthesizing circuit 22. As a result, the encoder 10 produces a complete set of thirteen binary outputs having order numbers of 0 through 12. The first eleven binary outputs are designated $2^0$ through $2^{11}$. The twelfth binary output is provided by the digitized or normalized output $n \sin 2^{12}x$. Thus, the synthesizing circuit 22 increases the number of bits in the binary output code word by one bit, without increasing the number of tracks on the code member 12.

The present invention is not limited to any particular number of tracks in the code member 12, or any particular number of output signals. In general, the invention is applicable to an encoder having any desired number n of output signals. In the encoder 10 of FIGS. 1a and 1b, n=12. The code member has code tracks with successive order numbers of 0 through n, except for one omitted or skipped track having an order number of n minus 1. To express this relation in another way, the code member has tracks with order numbers of 0 through n minus 2 and n. In the embodiment of FIGS. 1a and 1b, the order number n minus 2 is equal to 10, while the order number n minus 1 is equal to 11.

The skipped track binary output signal $2^{n-1}$ is synthesized by providing a parity detector having inputs which are supplied with the binary signals having order numbers of 0 through n minus 2. An exclusive OR gate or logic device is provided, having inputs which are supplied with the even output of the parity detector and with the digitized signal having the order number of n.

The exclusive OR gate produces an output constituting the skipped track binary output signals $2^{n-1}$.

As previously indicated, FIG. 2 illustrates the square waveforms of the digitized sine and cosine signals n sin $2^{12}$x and n cos $2^{12}$x. FIG. 2 also shows the tenth order binary output $2^{10}$, the odd/even (O/D) output of the parity detecting circuit, and the synthesized output $2^{11}$, resulting from the action of the exclusive OR gate in combining the odd/even (O/D) signal with the digitized sine signal n sin $2^{12}$x.

In FIG. 1a, the parity detector 26 may be in the form of a commercially available integrated circuit, type SN74S280. The exclusive OR gates may also be in the form of commercially available integrated circuits. Those skilled in the art will be able to select various suitable components for use in the embodiments of the present invention. This invention is not to be limited to any particular selection of components. Moreover, other modifications, alternative constructions and equivalents may be employed, without departing from the true spirit and scope of the present invention.

I claim:

1. A shaft angle encoder, comprising
a rotatable code member having a multiplicity of code tracks ranging in order from zero to n except for the omission of a skipped track having the order of n minus 1,
the track of zero order having the largest divisions while the track of the order n has the finest divisions,
signal producing means including transducer means for reading the tracks and producing corresponding electrical signals,
a parity detector having inputs for receiving the electrical signals corresponding to the tracks having the orders of zero through n minus 2 and for producing a corresponding even/odd output indicated whether said last-mentioned signals are even or odd,
and an exclusive OR logic device having inputs for receiving the even/odd output of said parity detector and the electrical signal corresponding to the track of the order n,
said exclusive OR logic device producing an output which synthesizes the electrical output signals corresponding to the skipped track of the order n minus 1.

2. An encoder according to claim 1, in which
said track of the order n is a sine track which produces a sine wave electrical signal,
said signal producing means including means for digitizing said sine wave electrical signal and for supplying the digitized signal to said exclusive OR logic device.

3. An encoder according to claim 1, in which
said exclusive OR logic device takes the form of an exclusive OR gate.

4. An encoder according to claim 1, in which
said tracks of the orders from zero through n minus 2 are encoded in accordance with the Gray reflected binary code.

5. A shaft angle encoder, comprising a rotatable code member having a multiplicity of code tracks including Gray reflected binary tracks ranging in order from zero to n minus 2 and a sine wave track of the order n but omitting a skipped track having the order of n minus 1, the track of zero order having the largest divisions while the track of the order n has the finest divisions, transducer means for reading said code tracks and for producing binary electrical signals corresponding with said binary tracks and sine wave electrical signals corresponding with said sine wave track,
a parity detector having inputs for receiving the binary electrical signals corresponding to the binary tracks having the orders of zero through n minus 2 and for producing a corresponding even/odd output indicating whether said binary signals are even or odd,
a digitizer for digitizing the sine wave signals corresponding to the sine wave track of the order n and thereby producing corresponding digitized binary signals of the order n,
and an exclusive OR logic device having inputs for receiving the digitized binary signals of the order n and the even/odd output of said parity detector,
said exclusive OR logic device producing an output which synthesizes the binary electrical output signals corresponding to the skipped track of the order n minus 1.

6. An encoder according to claim 5, in which
said exclusive OR logic device takes the form of an exclusive OR gate.

7. A circuit for synthesizing skipped track output signals in a shaft angle encoder having a multiplicity of code tracks ranging in order from zero to n except for the omission of a skipped track having the order of n minus 1, the encoder having transducer means for reading the tracks and producing corresponding binary electrical signals, said circuit comprising
a parity detector having inputs for receiving the binary electrical signals corresponding to the tracks having the orders of zero through n minus 2 and for producing a corresponding even/odd output indicating whether the last-mentioned binary electrical signals are even or odd,
and an exclusive OR logic device having inputs for receiving the even/odd output of said parity detector and the binary electrical signal corresponding to the track of the order n,
said exclusive OR logic device producing a binary output which synthesizes the binary electrical output signals corresponding to the skipped track of the order n minus 1.

8. A circuit according to claim 7, in which
said exclusive OR logic device takes the form of an exclusive OR gate.

9. A circuit according to claim 7, in which
said parity detector has a number of inputs less than the number of electrical signals having the order numbers of zero through n minus 2,
said circuit including at least one exclusive OR gate connected to one of the inputs of said parity detector for increasing the effective number of inputs of said parity detector.

10. A circuit for synthesizing skipped track signals in a shaft angle encoder having a multiplicity of code tracks including Gray reflected binary tracks ranging in order from zero to n minus 2 and a sine wave track of the order n but omitting a skipped track having the order of n minus 1, the encoder having transducer means for reading the tracks and for producing binary electrical signals corresponding with the binary tracks and sine wave signals corresponding with the sine track, said circuit comprising
a parity detector having inputs for receiving the binary electrical signals corresponding to the binary tracks having the orders of zero through n minus 2 and for producing a corresponding even/odd output indicating whether said binary signals are even or odd, a digitizer for digitizing the sine wave signals from the sine track of the order n and thereby producing corresponding digitized binary signals of the order n, and an exclusive OR logic device having inputs for receiving the digitized binary signals of the order n and the even/odd output of said parity detector, said exclusive OR logic device producing an output which synthesizes the binary electrical output signals corresponding to the skipped track of the order n minus 1.

11. A circuit according to claim 10, in which said exclusive OR logic device takes the form of an exclusive OR gate.

12. A circuit according to claim 10, in which said parity detector has a number of inputs less than the number of binary electrical signals of the order numbers from zero through n minus 2, said circuit including at least one exclusive OR logic device connected to one of the inputs of said parity detector for effectively increasing the number of inputs of said detector.

* * * * *